(12) United States Patent
Monroe

(10) Patent No.: US 11,328,997 B2
(45) Date of Patent: May 10, 2022

(54) THROUGH-CORE VIA

(71) Applicant: Micron Technology, Inc., Boise, ID (US)

(72) Inventor: Matthew Monroe, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/830,693

(22) Filed: Mar. 26, 2020

(65) Prior Publication Data

US 2020/0227355 A1  Jul. 16, 2020

Related U.S. Application Data

(62) Division of application No. 15/946,139, filed on Apr. 5, 2018, now Pat. No. 10,629,536.

(51) Int. Cl.
*H01L 23/538* (2006.01)
*H01L 23/00* (2006.01)
*H01L 23/13* (2006.01)
*H01L 23/31* (2006.01)
*H01L 21/48* (2006.01)
(Continued)

(52) U.S. Cl.
CPC ........ *H01L 23/5384* (2013.01); *H01L 21/486* (2013.01); *H01L 21/4853* (2013.01); *H01L 21/565* (2013.01); *H01L 23/13* (2013.01); *H01L 23/3114* (2013.01); *H01L 23/5386* (2013.01); *H01L 24/16* (2013.01); *H01L 25/18* (2013.01);
(Continued)

(58) Field of Classification Search
CPC ............ H01L 23/5384; H01L 21/4853; H01L 21/486; H01L 21/565; H01L 23/13; H01L 23/3114; H01L 23/5386; H01L 24/16; H01L 25/18; H01L 25/50; H01L 2224/16225
USPC ........................................................ 257/668
See application file for complete search history.

(56) References Cited

U.S. PATENT DOCUMENTS 7,622,377 B2   11/2009   Lee et al.
8,278,214 B2   10/2012   Roy et al.
(Continued)

OTHER PUBLICATIONS

Kim, Jinseong et al., "Application of Through Mold Via (TMV) as PoP base package" IEEE, (2008) Jan. 1, 2008.
(Continued)

*Primary Examiner* — Jami Valentine Miller
(74) *Attorney, Agent, or Firm* — Perkins Coie LLP

(57) ABSTRACT

A package substrate for connecting together semiconductor devices with other semiconductor device packages. The package substrate includes an exposed core layer with at least one via exposing a conductive layer of the package substrate. A first portion of the package substrate may include a solder mask on top and bottom surfaces. A first semiconductor device may be connected to the first portion of the package substrate. Layers of a second portion of the package substrate are removed to expose a core layer and vias are created in the exposed core layer to expose the conductive layer. Conducive material at least partially filling the vias may be used to connect a semiconductor device package to the second portion of the package substrate. The semiconductor device packages may communicate through conductive layers in the package substrate. The package substrate may be used to connect the semiconductor packages to a motherboard.

16 Claims, 8 Drawing Sheets

(51) Int. Cl.
*H01L 21/56* (2006.01)
*H01L 25/00* (2006.01)
*H01L 25/18* (2006.01)

(52) U.S. Cl.
CPC .... *H01L 25/50* (2013.01); *H01L 2224/16225* (2013.01)

(56) References Cited

U.S. PATENT DOCUMENTS

| | | | |
|---|---|---|---|
| 9,570,142 B2* | 2/2017 | Shido | G11C 11/4076 |
| 9,761,564 B1* | 9/2017 | Shibata | H01L 25/0657 |
| 10,134,671 B1* | 11/2018 | Kirby | H01L 23/481 |
| 11,007,771 B2* | 5/2021 | Xiang | G01J 3/513 |
| 2012/0267773 A1 | 10/2012 | Ebefors et al. | |
| 2014/0196940 A1 | 7/2014 | Healy et al. | |
| 2016/0163624 A1 | 6/2016 | Fan | |
| 2017/0358336 A1* | 12/2017 | Shido | G11C 7/1069 |
| 2019/0138412 A1* | 5/2019 | Ogasawara | G11C 29/38 |
| 2019/0311987 A1* | 10/2019 | Monroe | H01L 21/565 |

OTHER PUBLICATIONS

US Patent and Trademark Office; Office Action for U.S. Appl. No. 15/946,139 dated Aug. 21, 2019 Aug. 21, 2019.

* cited by examiner

THROUGH-CORE VIA

RELATED APPLICATIONS

The present application is a divisional patent application of U.S. patent application Ser. No. 15/946,139 entitled Through-Core Via filed on Apr. 5, 2018 and published on Oct. 10, 2019 as U.S. Patent App. Pub. No. 2019/0311987, which is incorporated by reference herein in its entirety.

FIELD

The embodiments described herein relate to a substrate, or printed circuit board (PCB), for connecting together at least two semiconductor device packages and methods of providing the substrate, the substrate having a portion with an exposed core, or dielectric, layer with at least one via that exposes a portion of a conductive layer of the substrate.

BACKGROUND

Semiconductor device assemblies, including, but not limited to, memory chips, microprocessor chips, and imager chips, typically include a semiconductor device, such as a die, mounted on a package substrate. The package substrate and the die (or some portion of each) may be encased in a plastic protective covering (encapsulant) or metal heat spreader. The semiconductor device assembly may include various functional features, such as memory cells, processor circuits, and imager devices, and may include bond pads that are electrically connected to the functional features of the semiconductor device assembly. The semiconductor device assembly may include semiconductor devices stacked upon, and electrically connected to, one another by individual interconnects between adjacent devices within a package. The semiconductor device assemblies may include electrical interconnects (for example, solder balls) in an array pattern on the bottom of the package substrate to facilitate electrical connection to other semiconductor device assemblies or an electronic system.

Various methods and/or techniques may be employed to electrically interconnect adjacent semiconductor devices, semiconductor device packages, and/or substrates in a semiconductor device assembly. For example, in some applications two or more semiconductor device packages may be stacked one on top of another known as package-on-package (PoP) assembly. In particular, a PoP device may include an application processor in a lower package and one or more memory devices in an upper package mounted on the lower package. The memory devices may be electrically connected to the application processor using vias created in the lower package encapsulant that connect to interconnects (for example, solder balls) on the bottom of the upper package. The PoP device is configured to be mounted onto a main board or motherboard of an electronic system (such as, for example, a smart phone or tablet computer) using interconnects (for example, solder balls) on the bottom of the lower package. Accordingly, the application processor communicates directly with the memory devices in the PoP using electrically close connections (to minimize the negative electrical effects of longer electrical transmission lines) but is still able to connect directly to the main board of the electronic system to facilitate communications with other devices connected to the main board. One potential issue with PoP devices is the z height of the stacked semiconductor device packages. In some applications, the z height of a semiconductor device assembly may be limited due to space constraints. Additionally, in a PoP device, power and ground connections to each of the semiconductor device packages need to pass through each of the semiconductor device packages located below it in a PoP stack, which may cause a thermal issue and/or routing complexity within the semiconductor device assembly.

Another method of electrically connecting semiconductor device packages together is to place each semiconductor device package side-by-side, or adjacent to each other, on a substrate, such as a motherboard of an electronic system. The side-by-side configuration may require a larger footprint (i.e., x-y area) than the same devices in a PoP configuration, which may be problematic. For example, the area available on a substrate for semiconductor device packages may be limited depending on the application. Another potential disadvantage of a side-by-side configuration is that the semiconductor device packages cannot communicate directly between themselves. Rather, the communications must pass through the substrate or PCB, such as the motherboard, when communicating between two semiconductor device packages in a side-by-side configuration. In some instances, a system may include a large number of signals passing through the motherboard, and the motherboard may have many levels of electrical connections, thereby causing the electrical paths between the adjacent semiconductor device packages to be electrically far compared to the PoP device. This increased electrical length can potentially cause signal delays between the semiconductor device packages configured side-by-side on a motherboard. An increase in the signals through the motherboard may also cause thermal and/or routing issues.

As discussed above, a PoP package configuration provides close electrical connection between various semiconductor devices for applications where there is sufficient z height available to accommodate the stacked packages. However, due to the thermal, electrical, and/or physical drawbacks of the side-by-side configuration, a solution does not currently exist to provide close electrical connection between multiple semiconductor devices when z height is constrained, but there is x-y space available. Additional drawbacks and disadvantages may exist.

Figure 1:
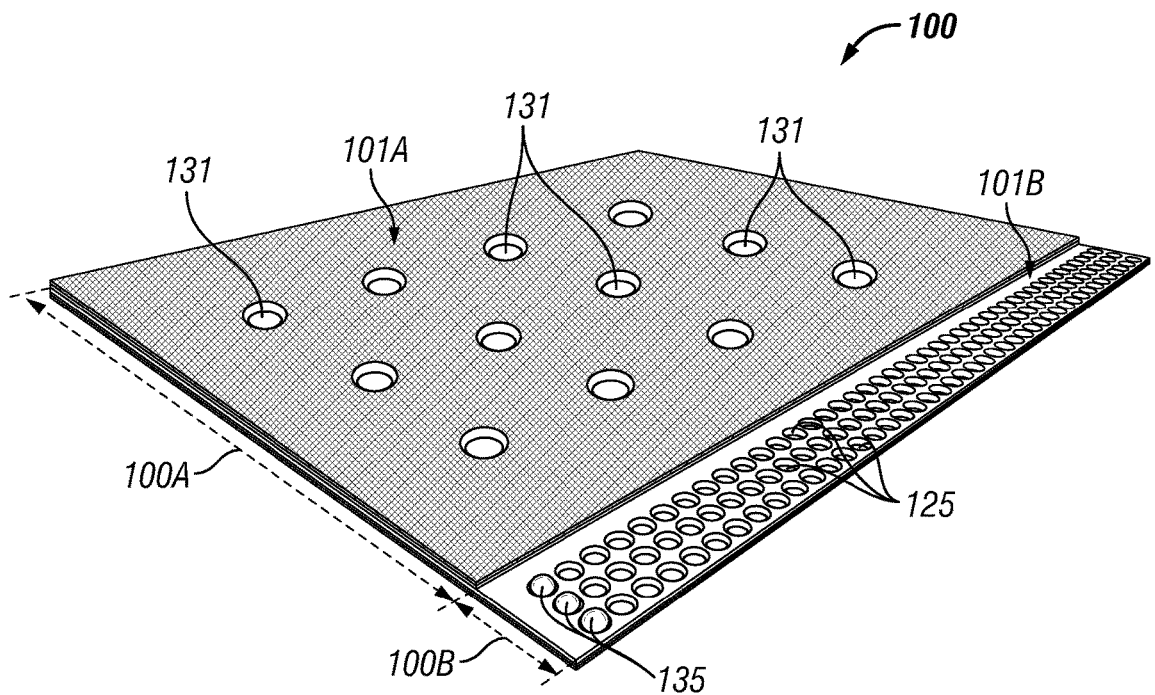
FIG. 1 is an isometric view of an embodiment of substrate having a plurality of vias through an exposed core, or dielectric, layer to expose a portion of a conductive layer.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices and semiconductor device packages may not be shown and/or may not be described in detail to avoid obscuring other aspects of the disclosure. In general, it should be understood that various other devices, systems, and/or methods in addition to those specific embodiments disclosed herein may be within the scope of the present disclosure.

The terms "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies. Moreover, a semiconductor device may have logic, memory, storage, or some other electronic functions, or a combination of any of these.

The term "semiconductor device package" can refer to an arrangement with one or more semiconductor devices incorporated into a common package. A semiconductor package can include a housing or casing (encapsulant) that partially or completely encapsulates at least one semiconductor device. A semiconductor package can also include a package substrate that carries one or more semiconductor devices. The package substrate may be attached to or otherwise incorporated within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, semiconductor device packages, and methods of making and/or operating semiconductor devices.

An embodiment of the disclosure is a package substrate comprising a substrate having a first portion having a first thickness and a second portion having a second thickness less than the first thickness, the first portion having a first surface and a second surface opposite the first surface. The first surface of the substrate being a first solder mask and the second surface of the substrate being a second solder mask, the first portion of the substrate having at least one first conductive layer, at least one second conductive layer, and at least one core layer between the first surface and the second surface, wherein the core layer is positioned between the first and second conductive layers. The second portion of the substrate having a third surface opposite the second surface, the third surface including an exposed portion of the core layer and at least one via through the core layer in the second portion of the substrate such that the via exposes a portion of the second conductive layer.

An embodiment of the disclosure is a semiconductor device assembly comprising a package substrate having a first portion with a first surface and a second surface opposite of the first surface with the second surface extending to a second portion of the substrate, the second portion of the substrate having a third surface opposite of the second surface. The third surface of the substrate being configured to connected to a semiconductor device package. The semiconductor device assembly including a first semiconductor device connected to the first surface of the first portion of the substrate and an encapsulate substantially surround the first semiconductor device and the first interconnects and covering at least a portion of the first surface.

An embodiment of the disclosure is a package substrate comprising a substrate having a first plurality of conductive layers and second plurality of core layers, each of the core layers being positioned between two conductive layers. The substrate having a first portion and a second portion, the first portion having a first thickness and the second portion having a second thickness that is less than the first thickness, the second portion of the substrate comprises an exposed core layer of the second plurality of core layers. The package substrate comprises one or more vias in the exposed core layer, the one or more vias exposing a portion of one conductive layer of the first plurality of conductive layers.

An embodiment of the disclosure is a method of making a semiconductor device assembly comprising connecting a semiconductor device to a first surface of a first portion of a package substrate, a second portion of the package substrate including an exposed portion of a core layer with at least one via through the core layer exposing a portion of a conductive layer. The method comprises encapsulating the semiconductor device and at least a portion of the first surface of the first portion of the package substrate.

A PCB may include a number of conductive layers that are separated from each other by insulating layers, which may be comprised of dielectric material. As used herein, the term "conductive layer" refers to a layer comprised of a conducting material. Conductive layers may be comprised of various materials as would be appreciated by one of ordinary skill in the art. For example, a conductive layer may be, but is not limited to, copper foil. The insulating layers are commonly referred to as core and/or prepreg layers. Core and/or prepreg layers may be comprised of various materials as would be appreciated by one of ordinary skill in the art. For example, such layers may be, but are not limited to, glass cloth, which may be made from fiber, glass, and epoxy. As used herein, the terms "core," "core layer," and "dielectric layer" refer to an insulating layer positioned between conductive layers of a PCB and/or substrate. A solder mask may be provided on a first or top surface of the PCB. Likewise, a solder mask may be provided on a second or bottom surface of the PCB. Openings or apertures in the solder mask on the first and/or second surface expose a portion of an adjacent conducting layer permitting the PCB to be electrically connected to semiconductor device or semiconductor device packages connected to the first and/or second surface of the PCB. Likewise, the apertures in the solder mask may permit the PCB to be electrically connected to another substrate as would be appreciated by one of ordinary skill in the art.

FIG. 1 is an isometric view of an embodiment of a package substrate 100 having a first portion 100A and a second portion 100B. The package substrate may be various structures as would be appreciated by one of ordinary skill in the art having the benefit of this disclosure. For example, the package substrate 100 may be, but is not limited to, a PCB, a silicon interposer, or a tape interposer. The first portion 100A includes a first, or top, surface 101A and a second, or bottom, surface 102 (best shown in FIG. 2) that extends to the second portion 100B of the package substrate 100. The first surface 101A of the first portion 100A of the package substrate 100 include a first solder mask 130A (best shown in FIG. 2). The second surface 102 of the package substrate 100 includes a second solder mask 130B (best shown in FIG. 2). The first solder mask 130A does not extend to the second portion 101B of the package substrate 100. In other words, the first solder mask 130A is absent from the second portion 100B of the package substrate 100.

The first solder mask 130A includes a plurality of openings, or apertures, 131 that expose a portion of a conductive layer 110A (best shown in FIG. 2) adjacent to the first solder mask 130A. Likewise, the second solder mask 130B includes a plurality of openings, or apertures, 131 that expose a portion of a conductive layer 110D (best shown in FIG. 2) adjacent to the second solder mask 130B. The apertures 131 in the solder masks 130A, 130B permit a semiconductor device, semiconductor device package, and/or substrate to be electrically connected to the package substrate 100 as would be appreciated by one of ordinary skill in the art having the benefit of this disclosure. The number, size, shape, location, and/or configuration of the apertures 131 in the solder masks 130A, 130B are shown for illustrative purposes and may be varied depending on the application as would be appreciated by one of ordinary skill in the art having the benefit of this disclosure.

The second portion 100B may provide an interface for the electrical connection to a semiconductor device package, as discussed herein. The second portion 100B of the package substrate 100 has a third, or top, surface 101B that comprises an exposed core, or dielectric, layer 120B (best shown in FIG. 2) of the package substrate 100. As shown in FIG. 1, the first solder mask 130A is absent from the third surface 101B of the second portion 100B of the substrate 100. The third surface 101B includes a plurality of vias 125 through the exposed core layer 120B that expose a portion of a conductive layer 110C (best shown in FIG. 2) adjacent to the exposed core layer 120B, which comprises the top surface 101B of the second portion 100B of the package substrate 100. A conductive material may at least partially, or completely, fill each of the vias 125. For example, solder balls 135 may be positioned in each via 125. Solder balls 135 are not shown in each via 125 for clarity. The number, size, shape, location, and/or configuration of the solder balls 135 and/or vias 125 through the exposed core layer 120B are shown for illustrative purposes and may be varied depending on the application as would be appreciated by one of ordinary skill in the art having the benefit of this disclosure.

Figure 2:
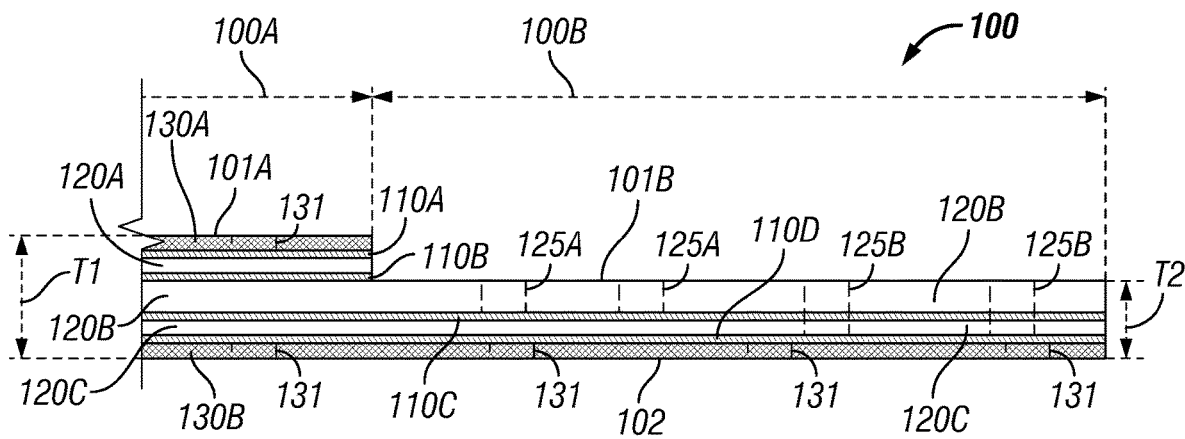
FIG. 2 is a cross-section schematic of an embodiment of a package substrate having a plurality of vias through an exposed core, or dielectric, layer to expose a portion of a conductive layer.

FIG. 2 is a cross-section schematic of an embodiment of a package substrate 100 having a plurality of vias, collectively, 125 through an exposed core, or dielectric, layer 120B to expose a portion of the adjacent conductive layer 110C. FIG. 2 shows that the first portion 100A of the package substrate 100 is a four layer plus core PCB. In other words, the first portion 100A of the substrate includes four conductive layers 110A, 110B, 110C, 110D with each conductive layer 110A, 110B, 110C, 110D separated from each other with a respective core layer 120A, 120B, 120C. The package substrate 100 includes interconnects (not shown) that electrically connect the four conductive layers 110A, 110B, 110C, 110D as would be appreciated by one of ordinary skill in the art. A first solder mask 130A is positioned adjacent conductive layer 110A and a second solder mask 130B is positioned adjacent conductive layer 110D. As discussed herein, the solder masks 130A, 130B include openings, or apertures, 131 that expose portions of the adjacent conductive layers 110A, 110D to enable the package substrate 100 to be electrically connected to devices and/or a substrate (such as a main board in an electronic system) as would be appreciated by one of ordinary skill in the art. The package substrate 100 is shown as a four-layer plus core PCB for illustrative purposes. The number of conductive layers, collectively, 110 and core layers, collectively, 120 may be varied depending on the application as would be appreciated by one of ordinary skill in the art having the benefit of this disclosure. In particular, the package substrate 100 may have only two conductive layers 110 and a single core layer 120 therebetween.

The core layer 120B is exposed on the second portion 100B of the package substrate 100. Various mechanisms may be used to expose the core layer 120B as would be appreciated by one of ordinary skill in the art. For example, the first solder mask 130A may not be deposited on the conductive layer 110A on the second portion 100B of the package substrate 100 and the conductive layers 110A, 110B and the core layer 120A may be etched away from the second portion 100B of the substrate 100 to expose the core layer 120B. Alternatively, the first solder mask 130A may be removed from the second portion 100B of the package substrate 100 prior to etching away the conductive layers 110A, 110B and the core layer 120A. The removal of the conductive layers 110A, 110B and the core layer 120A results in the second portion 100B of the package substrate 100 having a second thickness, T2, that is less than the first thickness, T1, of the first portion 100A of the package substrate 100. The reduction in thickness, T2, for the second portion 100B of the package substrate 100 may enable a reduction in the z height of a semiconductor device package connected to the exposed core layer 120B of the second portion 100B of the package substrate 100.

The exposed core layer 120B of the second portion 100B includes one or more vias 125 through the exposed core layer 120B. The vias 125 may be drilled via a laser through the exposed core layer 120B. Other mechanisms may be used to form the vias 125 as would be appreciated by one of ordinary skill in the art having the benefit of this disclosure. For example, a mechanical drill may be used to form the vias 125 through the exposed core layer 120B. As shown in FIG. 2, vias 125A may be drilled through the exposed core layer 120B to expose a portion of the adjacent conductive layer 110C. Alternatively, vias 125B may be drilled through the exposed core layer 120B, the adjacent conductive layer 110C, and the core layer 120C to expose conductive layer 110D, as shown in FIG. 2. The configuration of the vias, collectively, 125 on the second portion 100B of the package substrate 100 enables two semiconductor device packages to be electrically connected together in a side-by-side configuration and enables the semiconductor device packages to communicate without needing to communicate through a motherboard, as discussed herein.

Figure 3:
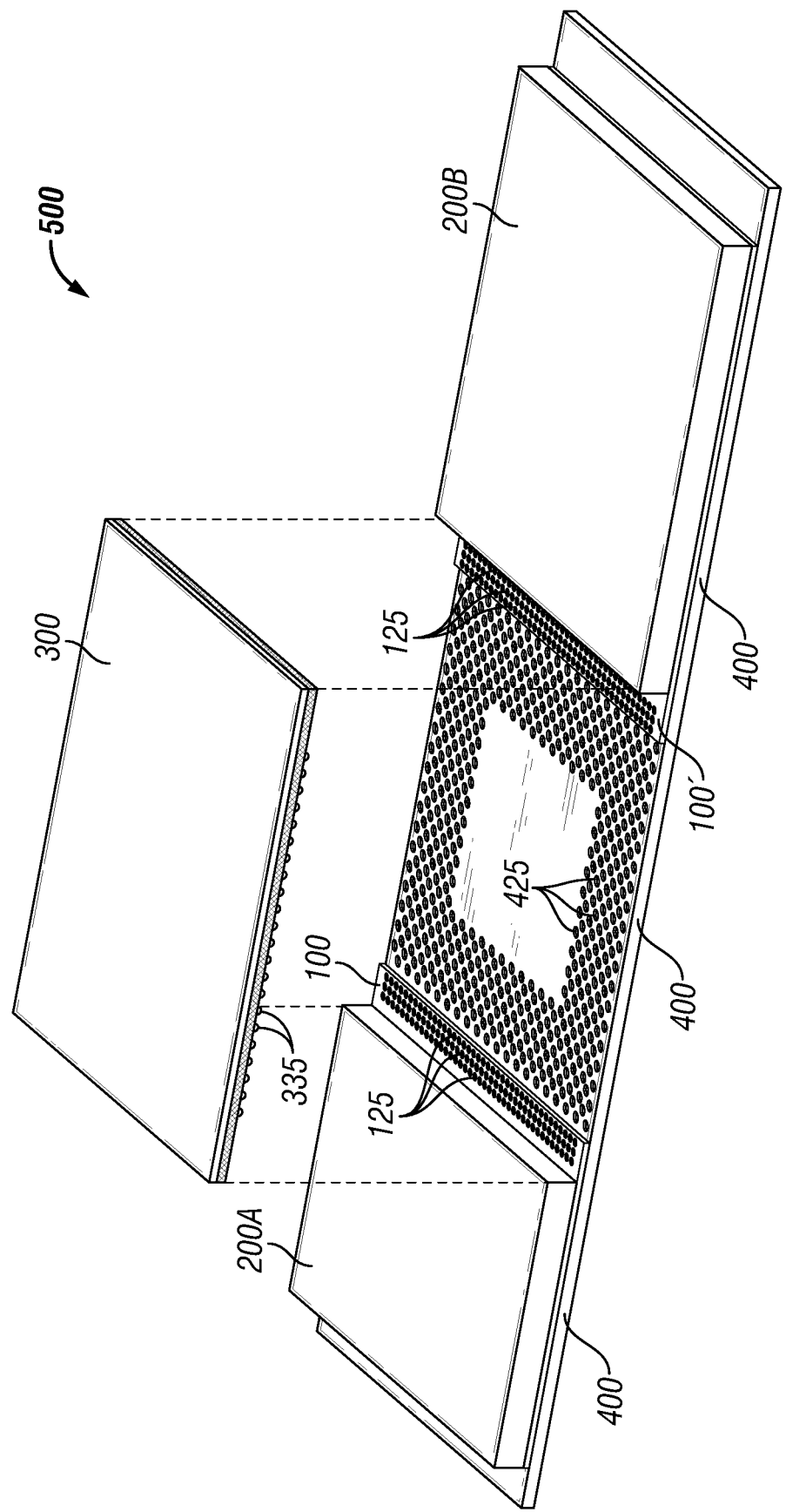
FIG. 3 is a schematic of an embodiment of a semiconductor device assembly.

FIG. 3 is a schematic of an embodiment of a semiconductor device assembly 500. The semiconductor device assembly 500 includes two first semiconductor device packages 200A, 200B, a second semiconductor device package 300, and a motherboard 400. The first semiconductor device packages 200A, 200B may be memory packages. The first semiconductor device packages 200A, 200B may not be identical. For example, first semiconductor device package 200A may include, but is not limited to, 128 GB NAND flash, 4 GB DRAM, and a controller (which may be, for example, an eMCP device) and first semiconductor device package 200B may include, but is not limited to, 128 GB NAND flash and a controller (which may be, for example, an eMMC device). The first semiconductor device packages 200A, 200B may include one or more semiconductor devices packaged together as would be appreciated by one of ordinary skill in the art. The first semiconductor device packages 200A, 200B may each include a memory controller or, alternatively, one of the first semiconductor device packages 200A, 200B may include a single controller configured to operate for both semiconductor device packages 200A, 200B. The second semiconductor device package 300 may be, but is not limited to, a processor. Each semiconductor device package 200A, 200B includes electrical connections between the semiconductor devices therein and the respective package substrate. These electrical connections may include, for example, wire bonds, solder balls, and/or interconnect pillars. Additionally, when a semiconductor device package 200A or 200B contains two or more semiconductor devices in a stacked arrangement, the semiconductor devices may be stacked in various configurations, including, for example, a cube-type stack or a shingle-stack arrangement. The semiconductor devices in the stack may be electrically connected to each other and/or the respective package substrate using, for example, wire bonds, solder balls, interconnect pillars, and/or through-silicon-vias (TSVs). Each semiconductor device package 200A, 200B may include an encapsulant that encapsulates the semiconductor devices, the electrical connections from the semiconductor devices to the respective package substrate, and at least a portion of the respective package substrate.

Each of the two first semiconductor device packages 200A, 200B includes a first portion 100A (best shown in FIGS. 1-2) of a package substrate 100, 100'. The semiconductor device packages 200A, 200B include package substrates 100, 100'. The second surface 102 (best shown in FIGS. 1-2) of the package substrates 100, 100' is connected to the motherboard 400. The substrates 100, 100' each may be connected to the motherboard 400 by various mechanisms as would be appreciated by one of ordinary skill in the art having the benefit of this disclosure. For example, the package substrates 100, 100' may be connected to the motherboard 400 using interconnects (such as solder balls, as discussed below) in an array pattern (for example, a land grid array (LGA) pattern), solder paste, thermal paste, or some other adhesive material.

A second portion 100B (best shown in FIGS. 1-2) of each package substrate 100, 100' extends beyond the encapsulant of the semiconductor packages 200A, 200B, as shown in FIG. 3. The second portion 100B includes a plurality of vias 125 that enable the second semiconductor device package 300 to be electrically connected to both package substrates 100, 100'. Conductive material, such as solder balls, (not shown for clarity) may be used to electrically connect the second semiconductor device package 300 to the second portions 100B of each of the package substrates 100, 100'. The package substrates 100, 100' enable communication between the second semiconductor device package 300, which may be a processor, and the semiconductor devices in each of the first semiconductor device packages 200A, 200B, which may be memory packages, without the need to send the communication signals through the motherboard 400 as would be appreciated by one of ordinary skill in the art having the benefit of this disclosure. Accordingly, the semiconductor devices in the first semiconductor device packages 200A, 200B can be electrically close to the second semiconductor device package 300.

The motherboard 400 may include a plurality of vias or pads 425 that enable the second semiconductor device package 300 to be electrically connected to the motherboard 400. Solder balls 335 are shown on the bottom of the second semiconductor device package 300 for illustrative purposes. Different sized solder balls, or other conductive material, may electrically connect the second semiconductor device package 300 to the motherboard 400 than the size of the solder balls used to electrically connect the second semiconductor device package 300 to the second portions 100B of the package substrates 100, 100'. FIG. 3 shows a symmetrical configuration of first semiconductor device packages 200A, 200B on a motherboard 400. However, other configurations may be used depending on the application as would be appreciated by one of ordinary skill in the art having the benefit of this disclosure.

Figure 4:
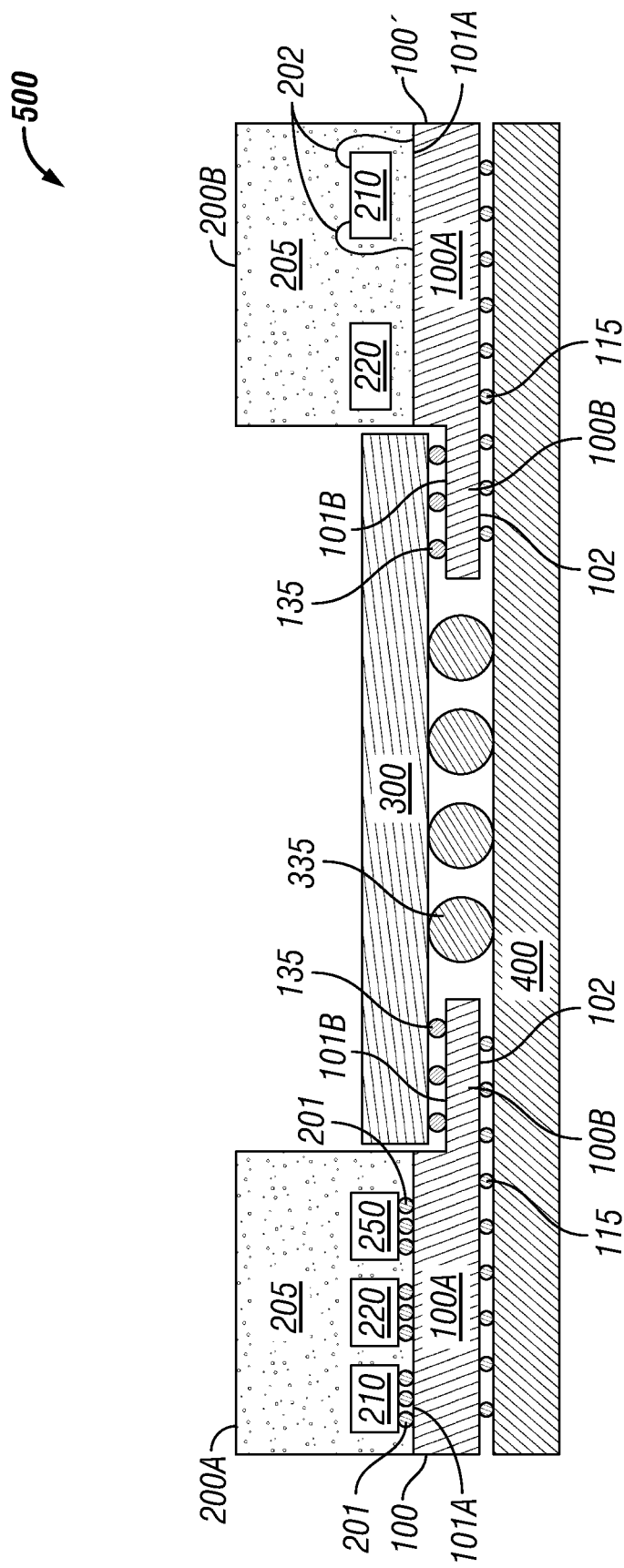
FIG. 4 is a cross-section schematic of an embodiment of a semiconductor device assembly.

FIG. 4 is a cross-section schematic of a semiconductor device assembly 500. As shown, the first semiconductor device packages 200A, 200B may not be identical. For example, first semiconductor device package 200A includes semiconductor devices 210, 220, and 250 within packaging material or encapsulant 205, which may be a mold compound, whereas first semiconductor device package 200B only includes semiconductor devices 210 and 220 within packaging material 205. Semiconductor devices 210 and 220 may be memory semiconductor devices and semiconductor device 250 may be a controller. Various mechanisms may be used to connect the semiconductor devices 210, 220, 250 of the semiconductor device packages 200A, 200B to the respective substrate 100, 100' as would be appreciated by one of ordinary skill in the art having the benefit of this disclosure. For example, solder balls 201 may connect semiconductor devices 210, 220, 250 of semiconductor device package 200A to the package substrate 100. Likewise, wire bonds 202 may connect semiconductor devices 210, 220 of semiconductor device package 200B to the package substrate 100'. The substrates 100, 100' each may be connected to the motherboard 400 by various mechanisms as would be appreciated by one of ordinary skill in the art having the benefit of this disclosure. For example, the package substrates 100, 100' may be connected to the motherboard 400 using interconnects (such as solder balls, as discussed below) in an array pattern (for example, a land grid array (LGA) pattern), solder paste, thermal paste, or some other adhesive material.

The second surface 102 of each package substrate 100, 100' is connected to a second substrate 400, which may be a motherboard (hereinafter referred to as motherboard). Electrical connections 115, which may be solder balls, may electrically connect each substrate 100, 100' to the motherboard 400. The electrical connections 115 may be configured to only provide power and ground from the motherboard 400 to the substrates 100, 100'. In another configuration, the electrical connections 115 may be dummy connections with all communication and power between the substrates 100, 100' and the motherboard 400 being routed through the connections between the second semiconductor device package 300 and the motherboard 400.

The second semiconductor device package 300 is connected to second portions 100B of the package substrates 100, 100' via electrical connections 135. The electrical connections 135 enable signals to be sent between the first semiconductor device packages 200A, 200B and the second semiconductor device package 300 without being routed through the motherboard 400. The second semiconductor device package 300 is connected to the motherboard 400 via electrical connections 335, which may be solder balls. The solder balls 335 connecting the second semiconductor device package 300 to the motherboard 400 may be larger than the solder balls 135 connecting the second semiconductor device package 300 to the package substrates 100, 100' due to the thickness, T2, of the second portion 100B of the package substrates 100, 100'.

The number, size, shape, location, and/or configuration of the various components of the semiconductor device assembly 500 are not necessarily drawn to scale. The number, size, shape, location, and/or configuration of the semiconductor devices 210, 220, 250, the packaging material 205, the package substrates 100, 100', the first semiconductor device packages 200A, 200B, the second semiconductor device package 300, the connections 115, 135, 335, and the motherboard 400 are shown for illustrative purpose and may be varied depending on the application as would be appreciated by one of ordinary skill in the art having the benefit of this disclosure.

Figure 5:
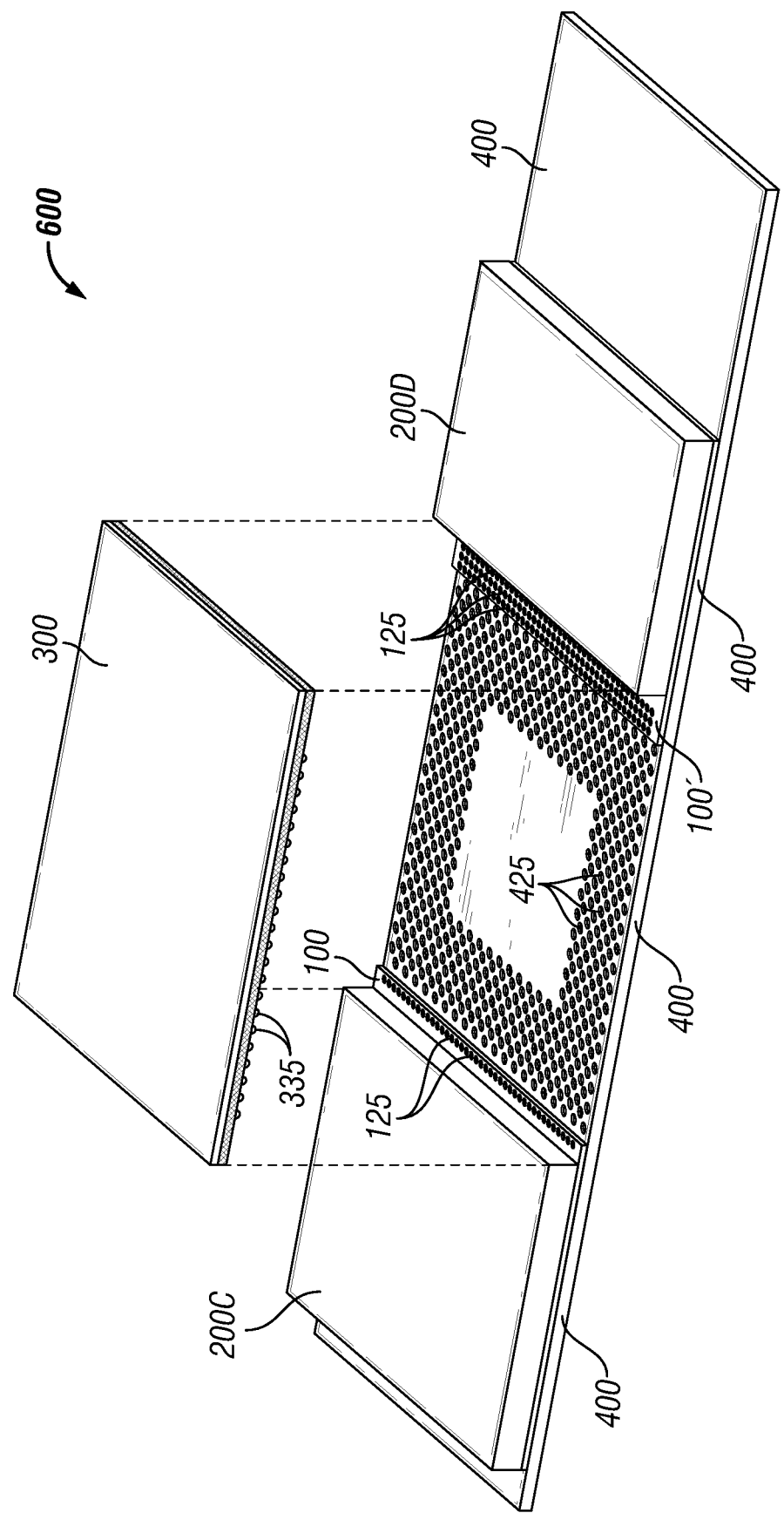
FIG. 5 is a schematic of an embodiment of a semiconductor device assembly.

FIG. 5 is a schematic of an embodiment of a semiconductor device assembly 600. The semiconductor device assembly 600 includes two first semiconductor device packages 200C, 200D and a second semiconductor device package 300 and a motherboard 400. The first semiconductor device packages 200C, 200D may be memory packages. The first semiconductor device packages 200C, 200D may not be identical. For example, first semiconductor device package 200C may comprise 256 GB NAND flash and a controller and first semiconductor device package 200D may comprise 8 GB LPDRAM. The size and/or shape of the first semiconductor device packages 200C, 200D may provide for an asymmetrical configuration, as shown in FIG. 5.

Each of the two first semiconductor device packages 200C, 200D include a first portion 100A (best shown in FIGS. 1-2) of a respective package substrate 100, 100'. The second surface 102 (best shown in FIGS. 1-2) of each of the package substrates 100, 100' is connected to the motherboard 400. The package substrates 100, 100' each may be connected to the motherboard 400 by various mechanisms as would be appreciated by one of ordinary skill in the art having the benefit of this disclosure.

A second portion 100B (best shown in FIGS. 1-2) of each package substrate 100, 100' extends beyond the encapsulant of the first semiconductor device packages 200C, 200D. As shown in FIG. 5, the second portions 100B of each package substrate 100, 100' that extends beyond the encapsulant of the first semiconductor device packages 200C, 200D may differ in length. Each of the second portions 100B of the package substrates 100, 100' includes a plurality of vias 125 that enable the second semiconductor device package 300 to be electrically connected to each package substrate 100, 100'. Conductive material, such as solder balls, (not shown for clarity) may be used to electrically connect the second semiconductor device package 300 to the second portions 100B of each of the package substrates 100, 100'. The package substrates 100, 100' enable communication between the second semiconductor device package 300, which may be a processor, and each of the first semiconductor device packages 200C, 200D, which may be memory packages, without the need to send the communication signals through the motherboard 400 as would be appreciated by one of ordinary skill in the art having the benefit of this disclosure. As discussed herein, the motherboard 400 may include a plurality of vias or pads 425 that enable the second semiconductor device package 300 to be electrically connected to the motherboard 400.

Figure 6:
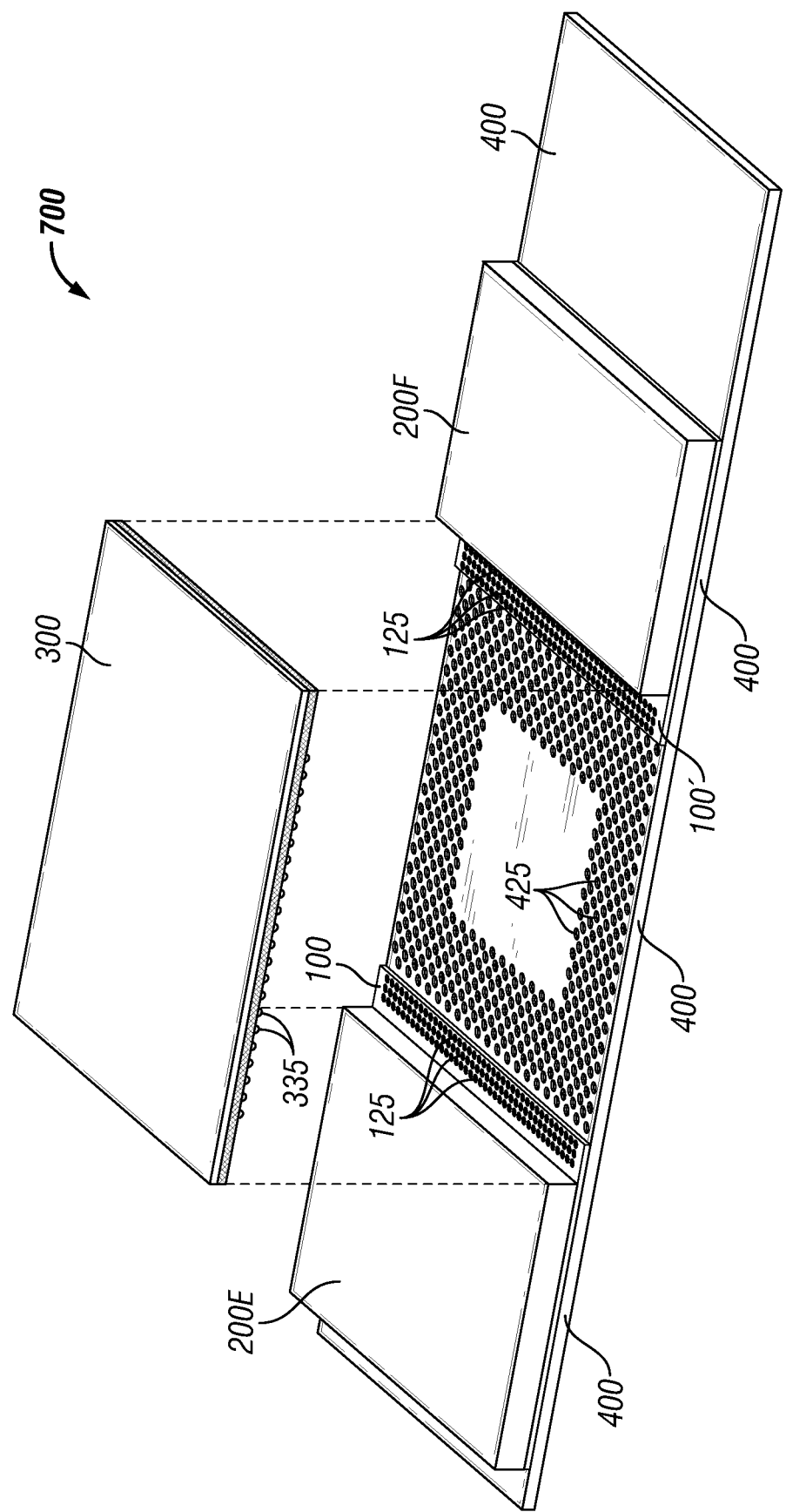
FIG. 6 is a schematic of an embodiment of a semiconductor device assembly.

FIG. 6 is a schematic of an embodiment of a semiconductor device assembly 700. The semiconductor device assembly 700 includes two first semiconductor device packages 200E, 200F and a second semiconductor device package 300 and a motherboard 400. The first semiconductor device packages 200E, 200F may be memory packages. The first semiconductor device packages 200E, 200F may not be identical. For example, first semiconductor device package 200E may comprise 256 GB NAND flash, 4 GB LPDRAM, and a controller and first semiconductor device package 200F may comprise 4 GB LPDRAM. The size and or shape of the first semiconductor device packages 200E, 200F may provide for a symmetrical configuration or an asymmetrical configuration, as discussed herein. The first semiconductor device packages 200E, 200F, and the second semiconductor device package 300 may be electrically connected through the package substrates 100, 100' in a similar fashion as the corresponding components in FIG. 5.

Figure 7:
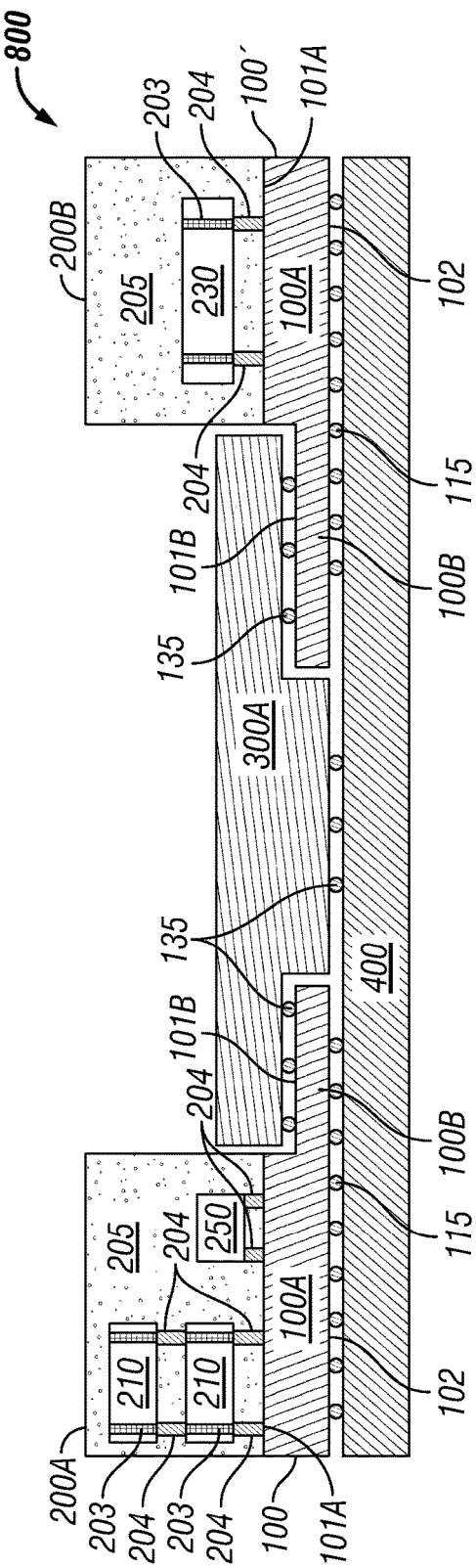
FIG. 7 is a cross-section schematic of an embodiment of a semiconductor device assembly.

FIG. 7 is a cross-section schematic of a semiconductor device assembly 800. The semiconductor device assembly 800 includes two first semiconductor device packages 200A, 200B, which both may be memory packages. As shown, the first semiconductor device packages 200A, 200B may not be identical. For example, first semiconductor device package 200A includes semiconductor devices 210 and 250 within packaging material 205, which may be a mold compound, whereas first semiconductor device package 200B only includes semiconductor device 230 within packaging material 205. Semiconductor devices 210 and 230 may comprise memory semiconductor devices and semiconductor device 250 may be a controller. The semiconductor devices 210, 230, and 250 within the first semiconductor device packages 200A, 200B may be in various configurations. For example, the semiconductor devices may be configured in a stack as shown with respect to semiconductor devices 210. Alternatively, the semiconductor devices may be arranged in a side-to-side configuration as shown with respect to semiconductor device 210 and semiconductor device 250. The semiconductor device packages 200A, 200B may include various numbers, sizes, shapes, and/or configurations of semiconductor devices as would be appreciated by one of ordinary skill in the art having the benefit of this disclosure.

Various mechanisms may be used to connect the semiconductor devices 210, 210 to each other and may be used to connect the semiconductor devices 210, 230 to the package substrates 100, 100' as would be appreciated by one of ordinary skill in the art. For example, through silicon vias (TSVs) 203 and pillars 204 may be used to connect semiconductor devices 210 together. Likewise, TSVs 203 and pillars 204 may be used to connect the semiconductor devices 210, 230 to the respective package substrates 100, 100'. First semiconductor device package 200A includes a surface 101A of a first portion 100A of a package substrate 100. Likewise, first semiconductor device package 200B includes a surface 101A of a first portion 100A of a package substrate 100'.

The second surface 102 of each package substrate 100, 100' is connected to a motherboard 400. Electrical connections 115, which may be solder balls, may electrically connect each substrate 100, 100' to the motherboard 400. The electrical connections 115 may be configured to only provide power and/or ground from the motherboard 400 to the substrates 100, 100'. In another configuration, the electrical connections 115 may be dummy connections with all communication and power between the substrates 100, 100' and the motherboard 400 being routed through the connections between the second semiconductor device package 300 and the motherboard 400.

A second semiconductor device package 300A, which may be a processor, is connected to second portions 100B of the package substrates 100, 100' via electrical connections 135. The electrical connections 135 enable signals to be sent between the first semiconductor device packages 200A, 200B and the second semiconductor device package 300A without being routed through the motherboard 400. The second semiconductor device package 300A may be configured to have a shape that conforms to the configuration of the package substrates 100, 100' and the motherboard 400. As shown in FIG. 7, the shape of the second semiconductor device package 300A may enable the electrical connections, e.g. solder balls 135, used to connect the package substrates 100, 100' to the second semiconductor device package 300A to be the same size as those used to electrically connect the second semiconductor device package 300A to the motherboard 400. It may be beneficial to use the same size solder balls 135 to connect the second semiconductor device package 300A to both of the package substrates 100, 100' and the motherboard 400 as would be appreciated by one of ordinary skill in the art having the benefit of this disclosure. In some embodiments, the solder balls 115 connecting the package substrates 100, 100' to the motherboard 400 may be the same size as the solder balls 135 electrically connecting the second semiconductor device package 300A to the package substrates 100, 100' and the motherboard 400.

The number, size, shape, location, and/or configuration of the various components of the semiconductor device assembly 800 are not necessarily drawn to scale. The number, size, shape, location, and/or configuration of the semiconductor devices 210, 230, 250, the packaging material 205, the package substrates 100, 100', the first semiconductor device packages 200A, 200B, the second semiconductor device package 300A, the connections 115, 135, and the motherboard 400 are shown for illustrative purpose and may be varied depending on the application as would be appreciated by one of ordinary skill in the art having the benefit of this disclosure.

Figure 8:
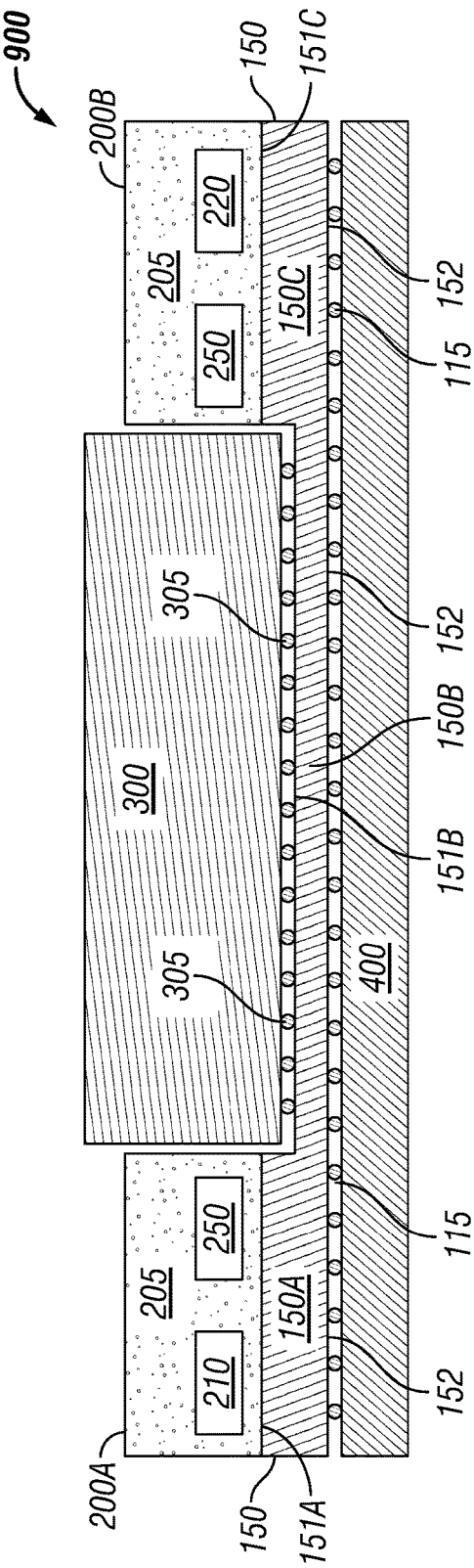
FIG. 8 is a cross-section schematic of an embodiment of a semiconductor device assembly.

FIG. 8 is a cross-section schematic of an embodiment of a semiconductor device assembly 900. The semiconductor device assembly 900 includes two first semiconductor devices packages 200A, 200B, which both may be memory packages. As shown, the first semiconductor device packages 200A, 200B may not be identical. For example, first semiconductor device package 200A includes semiconductor devices 210 and 250 within packaging material 205, which may be a mold compound, whereas first semiconductor device package 200B includes semiconductor devices 220 and 250 within packaging material 205. Semiconductor devices 210 and 220 may comprise memory semiconductor devices and semiconductor devices 250 may be a controller.

The semiconductor device packages 200A, 200B may include various numbers, sizes, shapes, and/or configurations of semiconductor devices as would be appreciated by one of ordinary skill in the art having the benefit of this disclosure.

Semiconductor devices 210, 250 of first semiconductor device package 200A are connected to a surface 151A of a first portion 150A of a package substrate 150. Additionally, packaging material 205 of first semiconductor device package 200A at least partially covers the surface 151A of the first portion 150A of the package substrate 150. Likewise, semiconductor devices 220, 250 of first semiconductor device package 200B are connected to a surface 151C of a third portion 150C of the package substrate 150. Various mechanisms may be used to connect the semiconductor devices 210, 220, 250 in first semiconductor packages 200A, 200B to the respective surfaces 150A, 150C of the package substrate 150 as would be appreciated by one of ordinary skill in the art having the benefit of this disclosure. The package substrate 150 includes a second portion 150B that is positioned between the first portion 150A and the third portion 150C of the substrate 150. The second portion 150B of the package substrate 150 includes a surface 151B that is an exposed core layer, as discussed herein.

A second surface 152 of the package substrate 150 is connected to a motherboard 400. Electrical connections 115, which may be solder balls, may electrically connect the package substrate 150 to the motherboard 400. A second semiconductor device package 300, which may be a processor, is connected to the second portion 150B of the substrate 150 via electrical connections 305. The electrical connections 305 enable signals to be sent between the first semiconductor device packages 200A, 200B and the second semiconductor device package 300 without being routed through the motherboard 400 as would be appreciated by one of ordinary skill in the art having the benefit of this disclosure.

The number, size, shape, location, and/or configuration of the various components of the semiconductor device assembly 900 are not necessarily drawn to scale. The number, size, shape, location, and/or configuration of the semiconductor devices 210, 220, 250, the packaging material 205, the package substrate 150, the first semiconductor device packages 200A, 200B, the second semiconductor device package 300, the connections 115, 305, and the motherboard 400 are shown for illustrative purpose and may be varied depending on the application as would be appreciated by one of ordinary skill in the art having the benefit of this disclosure.

Figure 9:
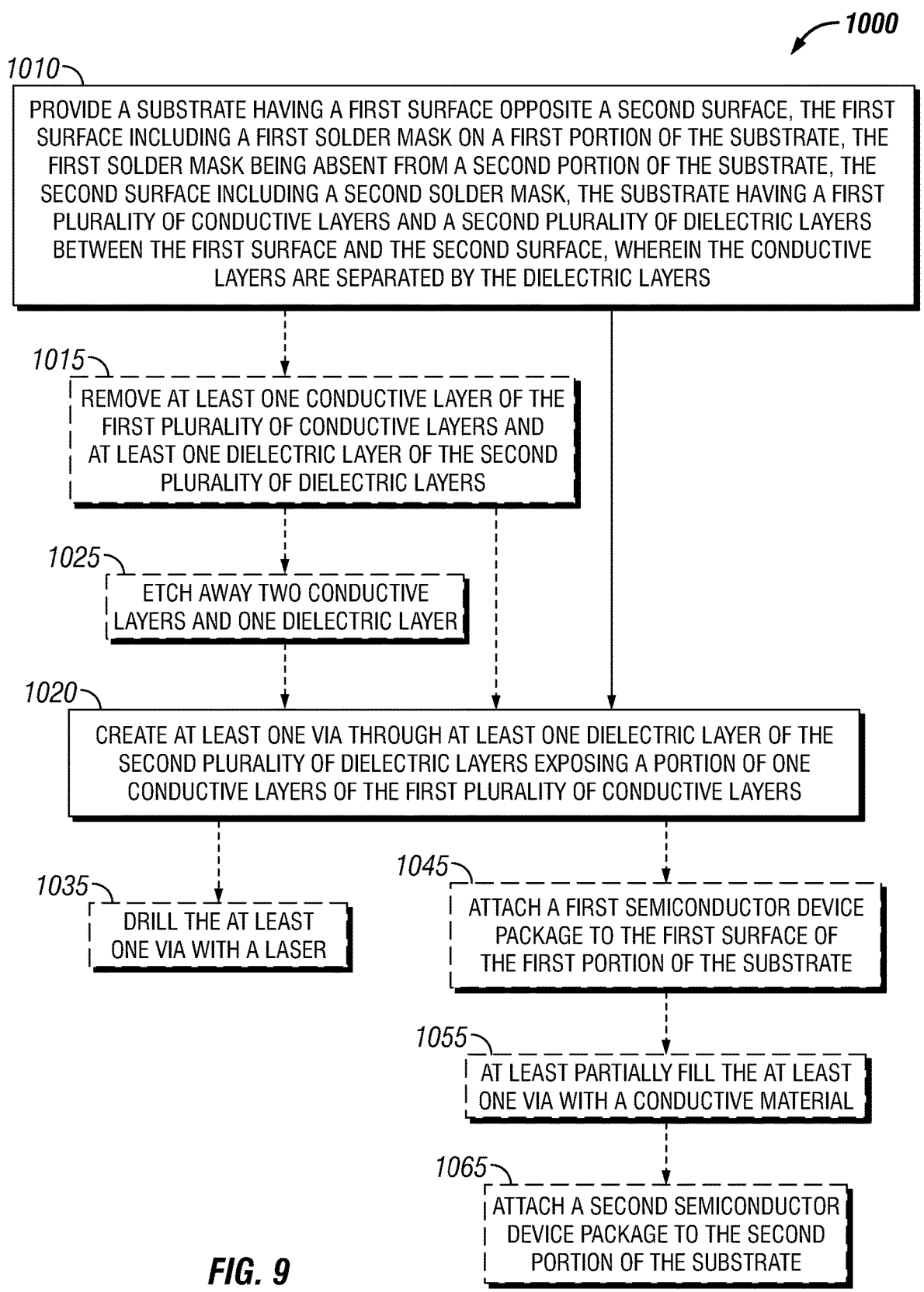
FIG. 9 is a flow chart depicting an embodiment of a method of making a semiconductor device assembly.

FIG. 9 is a flow chart of an embodiment of a method 1000 for making a semiconductor device assembly. The method 1000 includes providing a substrate having a first surface opposite a second surface, the first surface including a first solder mask on a first portion of the substrate, the first solder mask being absent from a second portion of the substrate, the second surface including a second solder mask, the substrate having a first plurality of conductive layers and a second plurality of dielectric layers between the first surface and the second surface, wherein the conductive layers are separated by the dielectric layers, at 1010. The method 1000 may include the optional steps of removing at least one conductive layer of the first plurality of conductive layers and at least one dielectric layer of the second plurality of dielectric layers, at 1015, and etching away two conductive layers and one dielectric layer, at 1025. The method 1000 comprises creating at least one via through at least one dielectric layer of the second plurality of dielectric layers exposing a portion of one conductive layer of the first plurality of conductive layers, at 1020.

The method 1000 may include drilling the at least one via with a laser, at 1035. Other methods may be used to form the at least one via as would be appreciated by one of ordinary skill in the art having the benefit of this disclosure. For example, a mechanical drill may be used to form the at least one via. The method 1000 may include the optional step of attaching a first semiconductor device package to the first surface of the first portion of the substrate, at 1045. For example, a memory package, or other semiconductor device package, may be attached to the first surface of the first portion of the substrate. The method 1000 may include at least partially filling the at least one via with a conductive material, at 1055. For example, the at least one via may be at least partially filled with a solder ball. The method 1000 may include attaching a second semiconductor device package to the second portion of the substrate, at 1065. For example, a processor may be attached to the second portion of the substrate.

Figure 10:
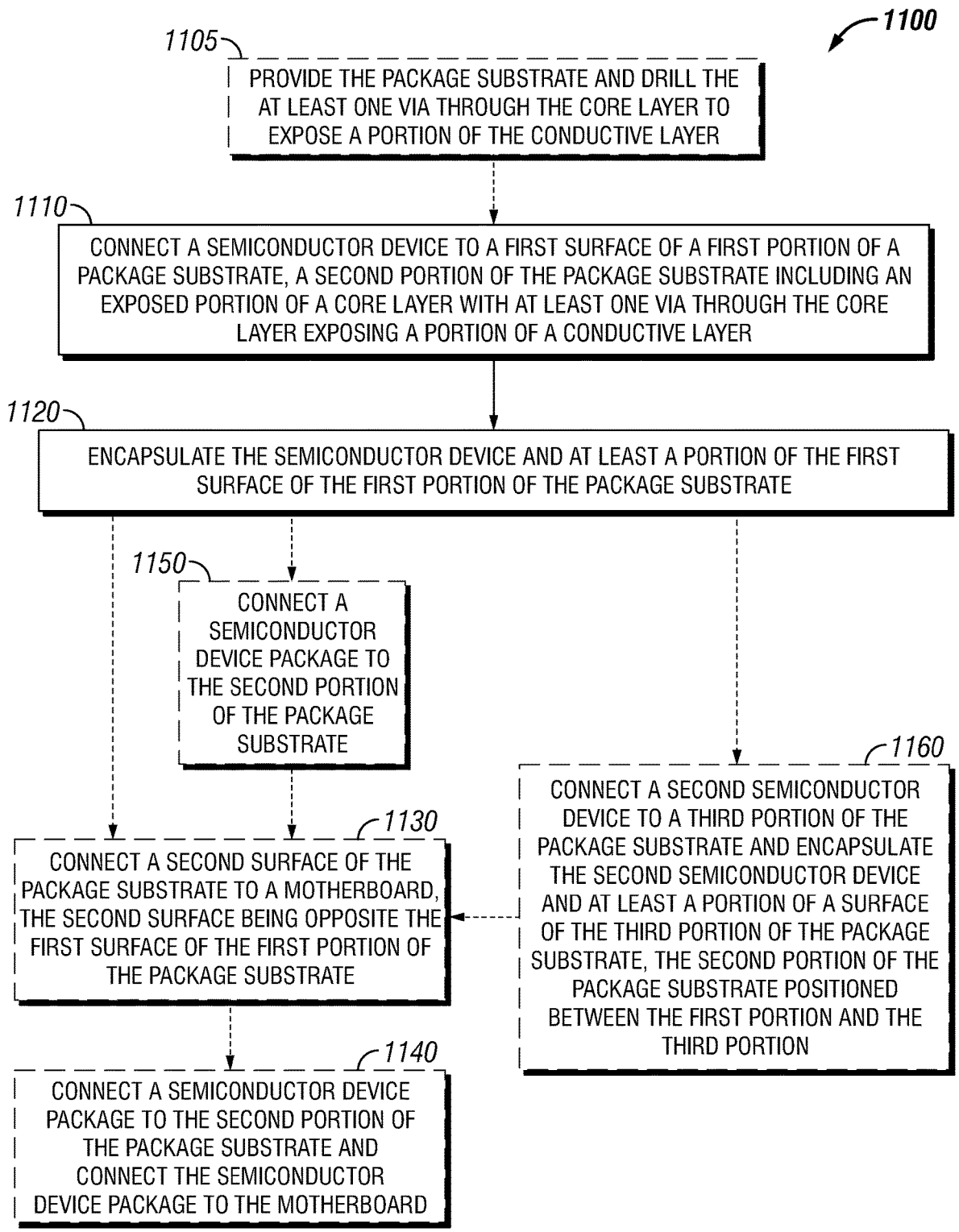
FIG. 10 is a flow chart depicting an embodiment of a method of making a semiconductor device assembly.

FIG. 10 is a flow chart of an embodiment of a method 1100 for making a semiconductor device assembly. The method 1100 includes connecting a semiconductor device to a first surface of a first portion of a package substrate, a second portion of the package substrate including an exposed portion of a core layer with at least one via through the core layer exposing a portion of a conductive layer, at 1110. The semiconductor device may be connected to the first surface of the package substrate by various mechanisms, as discussed herein. For example, the semiconductor device may be, but is not limited to, connected to the package substrate via wire bonds, solder balls, or TSVs and pillars. The method 1100 may optionally include providing the package substrate and drilling the at least one via through the core layer to expose a portion of the conductive layer prior to connecting the semiconductor device to the first surface of the first portion. The exposed core layer may include a plurality of vias that at least partially expose the conductive layer. The method 1100 includes encapsulating the semiconductor device at least a portion of the first surface of the first portion of the package substrate, at 1120.

The method 1100 may include connecting a second surface of the package substrate to a motherboard, the second surface being opposite the first surface, at 1130. The second surface of the package substrate extending to the second portion of the package substrate. The method 1100 may include connecting a semiconductor device package to the second portion of the substrate package and connecting the semiconductor device package to the motherboard, at 1140. The semiconductor device package may be connected to the semiconductor substrate through the at least one via through the core layer. The semiconductor device package may be a processor device. Connecting the semiconductor device package to the semiconductor substrate may include at least partially filling the at least one via with a conductive material.

The method 1100 may include connecting a semiconductor device package to the second portion of the package substrate, at 1150, prior to connecting the second surface of the package substrate to the motherboard. The method 1100 may include connecting a second semiconductor device to a third portion of the package substrate and encapsulating the second semiconductor device and at least a portion of a surface of the third portion of the package substrate, wherein the second portion of the package substrate is positioned between the first and third portions, at 1160. After connecting the second semiconductor device to the third portion and encapsulating the second semiconductor device, the method 1100 may include connecting a second surface of the package substrate to a motherboard, the second surface being opposite the first surface, at 1130, and connecting a semiconductor device package to the second portion of the substrate package and connecting the semiconductor device package to the motherboard, at 1140.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device assembly comprising:
 a package substrate having a first portion with a first surface and a second surface opposite the first surface of the first portion, the second surface extending to a second portion of the substrate, the second portion of the substrate having a third surface opposite the second surface, the third surface configured to connect to a semiconductor device package;
 at least one first semiconductor device connected to the first surface of the first portion of the substrate by a plurality of first interconnects; and
 an encapsulant substantially surrounding the first semiconductor device and the first interconnects and covering at least a portion of the first surface,
 wherein the third surface comprises a plurality of vias, wherein each of the plurality of vias is through a core layer in the package substrate, the vias exposing a portion of a conductive layer in the package substrate.

2. The assembly of claim 1, wherein the second surface of the package substrate is configured to connect to a motherboard.

3. The assembly of claim 1, comprising the semiconductor device package connected to the third surface of the second portion of the substrate by a plurality of second interconnects.

4. The assembly of 3, wherein the first semiconductor device comprises a memory device and the semiconductor device package comprises a processor.

5. The assembly of claim 4, further comprising a PCB connected to the second surface of the substrate.

6. The assembly of claim 1, the second surface of the package substrate connected to a motherboard and comprising electrical connections between the package substrate and the motherboard.

7. The assembly of claim 6, wherein the electrical connections are configured to provide power and ground from the motherboard to the package substrate.

8. The assembly of claim 7, wherein the semiconductor device communicates through the package substrate with the semiconductor device package connected to the third surface of the second portion of the substrate.

9. The assembly of claim 6, wherein the electrical connections between the package substrate and the motherboard are dummy electrical connections and wherein power and ground to the semiconductor device are provided from the semiconductor device package through the package substrate.

10. The assembly of claim 1, wherein the first semiconductor device comprises a memory device and a memory controller.

11. The assembly of claim 10, further comprising a processor device connected to the third surface of the second portion of the package substrate.

12. The assembly of claim 1, the package substrate having a third portion, the second surface extending to the third portion with a fourth surface of the third portion opposite the second surface, the fourth surface configured to connect to at least one second semiconductor device, wherein the second portion of the package substrate is positioned between the first portion of the package substrate and the third portion of the package substrate.

13. The assembly of claim 12, comprising the second semiconductor device connected to the fourth surface of the third portion of the package substrate by a plurality of third interconnects.

14. The assembly of claim 13, wherein the first semiconductor device and the second semiconductor device comprise memory devices.

15. The assembly of claim 14, comprising the semiconductor device package connected to the second portion of the package substrate.

16. The assembly of claim 15, wherein the semiconductor device package comprises a processor device.

* * * * *